(12) United States Patent
Wieting et al.

(10) Patent No.: US 8,906,732 B2
(45) Date of Patent: Dec. 9, 2014

(54) METHOD AND DEVICE FOR CADMIUM-FREE SOLAR CELLS

(71) Applicant: Stion Corporation, San Jose, CA (US)

(72) Inventors: Robert D. Wieting, Simi Valley, CA (US); Jason Todd Jackson, Hattiesburg, MS (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 14/155,143

(22) Filed: Jan. 14, 2014

(65) Prior Publication Data
US 2014/0308774 A1    Oct. 16, 2014

Related U.S. Application Data

(63) Continuation-in-part of application No. 13/236,286, filed on Sep. 19, 2011, now Pat. No. 8,628,997.

(60) Provisional application No. 61/389,129, filed on Oct. 1, 2010.

(51) Int. Cl.
*H01L 31/18* (2006.01)

(52) U.S. Cl.
CPC ..................................... *H01L 31/18* (2013.01)
USPC ................ 438/85; 438/95; 136/264; 136/265

(58) Field of Classification Search
USPC ......................................... 438/84, 85, 95, 105
See application file for complete search history.

(56) References Cited

U.S. PATENT DOCUMENTS

| | | | | |
|---|---|---|---|---|
| 4,095,006 A | * | 6/1978 | Jordan et al. | 427/427 |
| 4,612,411 A | * | 9/1986 | Wieting et al. | 136/265 |
| 4,751,149 A | * | 6/1988 | Vijayakumar et al. | 428/702 |
| 5,474,939 A | * | 12/1995 | Pollock et al. | 438/85 |
| 5,804,466 A | * | 9/1998 | Arao et al. | 438/95 |
| 5,948,176 A | * | 9/1999 | Ramanathan et al. | 136/264 |
| 6,107,562 A | * | 8/2000 | Hashimoto et al. | 136/252 |
| 7,179,677 B2 | * | 2/2007 | Ramanathan et al. | 438/95 |
| 7,390,731 B2 | * | 6/2008 | Kroll et al. | 438/608 |
| 7,611,573 B2 | * | 11/2009 | Bhattacharya | 106/286.6 |
| 7,947,524 B2 | * | 5/2011 | Wieting | 438/64 |
| 8,361,831 B2 | * | 1/2013 | Yane | 438/85 |
| 8,383,450 B2 | * | 2/2013 | Wieting | 438/86 |
| 8,673,675 B2 | * | 3/2014 | Wieting | 438/64 |
| 2004/0235286 A1 | * | 11/2004 | Kroll et al. | 438/609 |
| 2005/0257825 A1 | * | 11/2005 | Ramanathan et al. | 136/262 |
| 2007/0157966 A1 | * | 7/2007 | Meguro et al. | 136/258 |
| 2007/0243657 A1 | * | 10/2007 | Basol et al. | 438/95 |

(Continued)

*Primary Examiner* — Earl Taylor
(74) *Attorney, Agent, or Firm* — Kilpatrick Townsend & Stockton LLP

(57) ABSTRACT

A method for fabricating a thin film photovoltaic device is provided. The method includes providing a substrate comprising a surface region made of a thin-film photovoltaic absorber including copper, indium, gallium, selenium, and sulfur species. Additionally, the method includes applying a dip-in chemical bath deposition process for forming a buffer layer containing at least zinc-ogygen-sulfide material but substantially free of cadmium species. Furthermore, the method includes producing a chemical bath including steps of heating a bath of water to about 75° C., adding aqueous ammonia to mix with the bath of water, adding a solution of sodium hydroxide, adding zinc salt solution, and adding a solution of thiourea. The dip-in chemical bath deposition process includes immersing a plurality of substrates formed with the thin-film photovoltaic absorber substantially vertically in the chemical bath for 30 minutes to form the zinc-oxygen-sulfide buffer layer followed by a cleaning and drying process.

15 Claims, 7 Drawing Sheets

(56) References Cited

U.S. PATENT DOCUMENTS

| | | | |
|---|---|---|---|
| 2008/0032044 A1* | 2/2008 | Kuriyagawa et al. | 427/255.33 |
| 2008/0115827 A1* | 5/2008 | Woods et al. | 136/255 |
| 2009/0087940 A1* | 4/2009 | Kushiya | 438/94 |
| 2009/0191359 A1* | 7/2009 | Bhattacharya | 427/560 |
| 2009/0223556 A1* | 9/2009 | Niesen et al. | 136/255 |
| 2010/0087027 A1* | 4/2010 | Wieting | 438/61 |
| 2010/0167460 A1* | 7/2010 | Yane | 438/85 |
| 2010/0243045 A1* | 9/2010 | Tsuchiya et al. | 136/256 |
| 2010/0255630 A1* | 10/2010 | Meyer et al. | 438/84 |
| 2011/0018103 A1* | 1/2011 | Wieting | 257/613 |
| 2011/0020959 A1* | 1/2011 | Wieting | 438/14 |
| 2011/0056541 A1* | 3/2011 | Martinez et al. | 136/252 |
| 2011/0212565 A1* | 9/2011 | Wieting | 438/64 |
| 2011/0259395 A1* | 10/2011 | Wieting et al. | 136/246 |
| 2011/0259413 A1* | 10/2011 | Wieting et al. | 136/256 |
| 2011/0263064 A1* | 10/2011 | Wieting | 438/61 |
| 2012/0073649 A1* | 3/2012 | Blue et al. | 136/258 |
| 2012/0240989 A1* | 9/2012 | Ramanathan et al. | 136/255 |

* cited by examiner

METHOD AND DEVICE FOR CADMIUM-FREE SOLAR CELLS

CROSS-REFERENCES TO RELATED APPLICATIONS

This application is a continuation-in-part application of U.S. patent application Ser. No. 13/236,286, filed on Sep. 19, 2011 by Kannan Ramanathan and Robert D. Wieting, which claims priority to U.S. Provisional Application No. 61/389,129, filed on Oct. 1, 2010, commonly assigned, and hereby incorporated by reference in its entirety herein for all purpose.

BACKGROUND OF THE INVENTION

The present invention relates generally to photovoltaic materials and manufacturing method. More particularly, the invention provides a device for a thin-film photovoltaic cell without a cadmium-based buffer layer and a method for making thereof. The present method and device provide a thin film photovoltaic cell using a copper indium diselenide absorber material and a cadmium-free window buffer material.

Environmentally clean and renewable sources of energy are desired. An example of a clean source of energy is hydroelectric power. Clean and renewable sources of energy also include wind, waves, biomass, and the like. That is, windmills convert wind energy into more useful forms of energy such as electricity. Still other types of clean energy include solar energy.

Solar energy technology generally converts electromagnetic radiation from the sun to other useful forms of energy. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, thin-film photovoltaic cells traditionally use exotic elements including cadmium, mercury, or telluride, which substantially limit the applications and cause environmental side effects. Often, such thin-film solar devices are difficult to handle during their manufacture processes because of these toxic materials.

From the above, it is seen that improved techniques for manufacturing photovoltaic materials and resulting devices are desired.

BRIEF SUMMARY OF THE INVENTION

The present invention provides a method and a structure for forming a photovoltaic cell. More particularly, the invention provides a method and a thin film device without using cadmium. Embodiments according to the present invention have been implemented in a thin film solar cell with copper-indium-gallium-diselenide (CIGS) based absorber material and cadmium-free window material.

In a specific embodiment, a method for fabricating a thin film photovoltaic device free from a heavy metal including cadmium is provided. The method includes providing a substrate comprising a thin film photovoltaic absorber. The thin film photovoltaic absorber comprises a surface region including copper species, indium species, gallium species, selenium species, and sulfur species. The surface region is coated with a material containing at least zinc, substantially free of cadmium. Additionally, the method includes a heating step within the surface region to cause formation of a zinc doped material within a depth of the thin-film photovoltaic absorber from the surface region. The heating step comprises using a lamp heater to cause the surface region and adjacent regions to increase from room temperature to about 190 degrees Fahrenheit while keeping the majority of the absorber material substantially at room temperature. Then a zinc oxide material is formed over the zinc doped material, followed by forming a transparent conductive material over the zinc oxide material.

In an alternative embodiment, the present invention provides a thin film photovoltaic device. The device includes a substrate and a barrier material overlying the substrate. The device further includes a first electrode overlying the barrier material. Additionally, the device includes an absorber material overlying the first electrode. The absorber material has a surface region and a thickness of a film region containing copper species, indium species, gallium species, selenium species characterized by a Cu/(In+Ga) ratio of 0.9±0.05 and a p-type conductivity. The device further includes a junction layer confined between the surface region and an interface region located a depth into the film region. The depth is a portion of the thickness of the film region. The portion is characterized by an n-type conductivity provided by dopants substantially free of cadmium species. Furthermore, the device includes a first zinc oxide layer overlying the junction layer and a second zinc oxide layer overlying the first zinc oxide layer. The first zinc oxide layer is characterized by a first resistivity and a first optical transparency and the second zinc oxide layer is characterized by a second resistivity and a second optical transparency. The first resistivity is substantially greater than the second resistivity and the second optical transparency is substantially equal to or greater than the first optical transparency.

In another alternative embodiment, the present invention provides a method for fabricating a Cd-free buffer layer for the manufacture of a thin film photovoltaic device. The method includes providing a plurality of substrates. Each of the substrates has a surface region on which an overlying first electrode material and a photovoltaic absorber material including at least a copper species, an indium species, and a selenium species are formed. The method further includes providing a chemical bath comprising an aqueous solution including a zinc salt species, an ammonia species, an organosulfur species, and a sodium hydroxide species. The chemical bath is maintained at a pH of between about 11 and about 12. Additionally, the method includes immersing the plurality of substrates in the chemical bath and maintaining the aqueous solution at a temperature ranging from about 70 to about 80 degrees Celsius during at least the immersing of the plurality of substrates. While the substrates are immersed, the method further includes forming a buffer material containing at least a zinc-oxygen-sulfide compound substantially free of cadmium with a thickness ranging from 10 nm to 30 nm overlying the photovoltaic absorber material. Furthermore, the method includes removing the plurality of substrates having at least the photovoltaic absorber material and the buffer material from the aqueous solution. Moreover, the method includes subjecting the plurality of substrates to a cleaning solution followed by a drying process.

Many benefits can be achieved by embodiments according to the present invention. For example, the thin film single junction photovoltaic cell can be fabricated in a simplified process, yet with conventional equipment. Advantages of the embodiments of the present method eliminate the use of toxic elements such as cadmium and use inexpensive chemical reagent to substantially increase the reaction growth rate for forming a Cd-free buffer layer in a chemical bath deposition process. The manufacture process is further simplified so that processing material is saved and environmental harm is reduced, yet the thin-film photovoltaic device achieves much improved photovoltaic efficiency without need of a Cd-based buffer layer. The device and its manufacturing method lead to a much improved cost saving and cleaner way to convert sunlight into electric energy. Depending on various embodiments, these and other benefits will be described in more detailed throughout the present specification and particularly below.

DETAILED DESCRIPTION OF THE INVENTION

Figure 1:
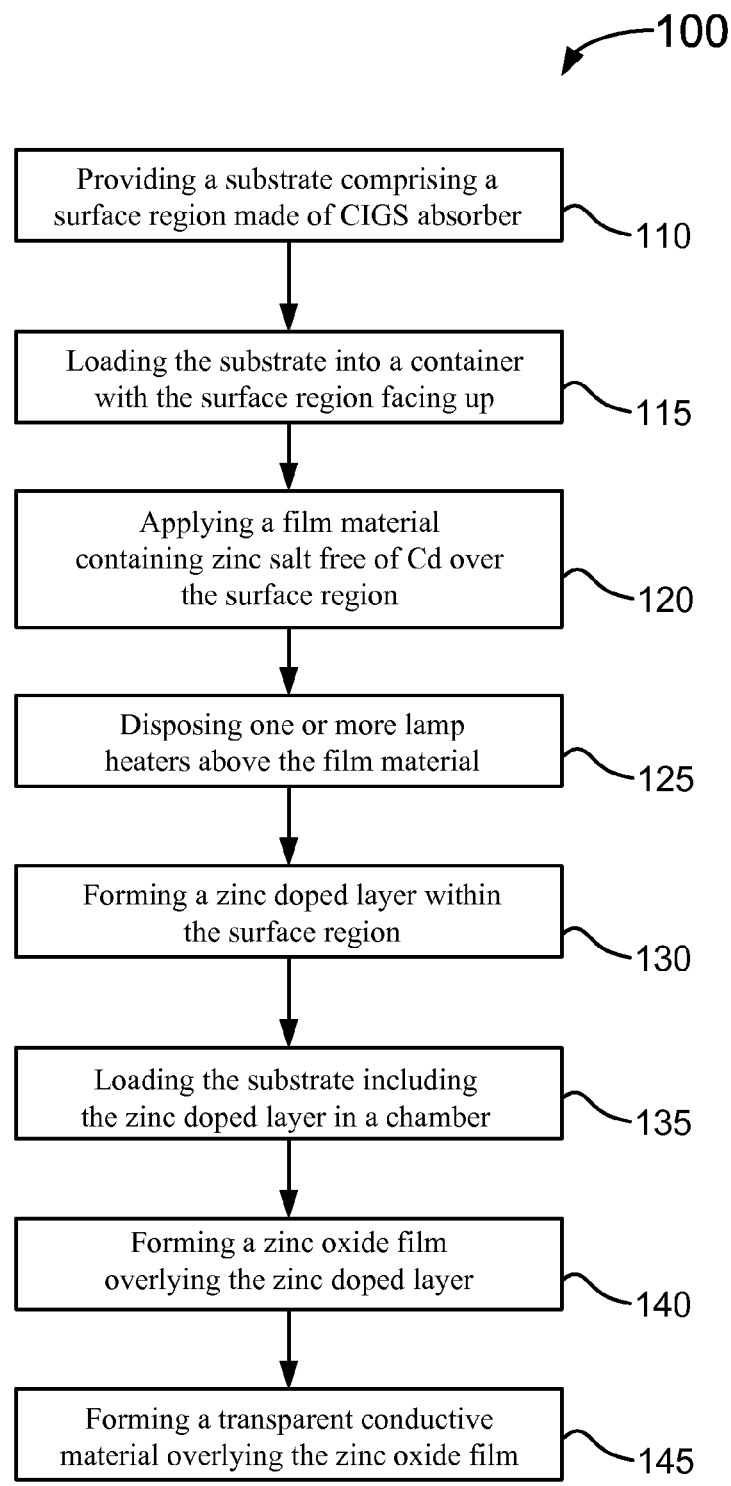
FIG. 1 is a simplified process flow diagram illustrating a method of fabricating a thin film photovoltaic device according to an embodiment of the present invention.
Figure 2:
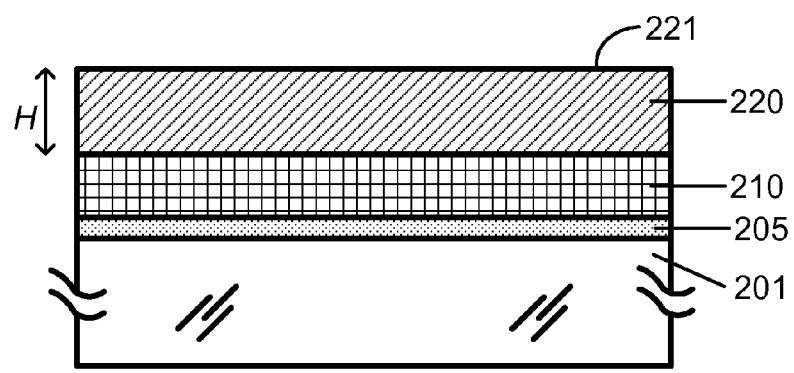
FIG. 2 is a simplified diagram illustrating a sectional view of a thin film device for fabricating Cd-free solar cells according to an embodiment of the present invention.

FIG. 1 is a process flow diagram illustrating a method of fabricating a thin film photovoltaic device. As shown, the method 100 begins with a process 110 for providing a substrate for fabricating a thin-film photovoltaic device. The resulting device is illustrated in FIG. 2. In the example, substrate 201 is a transparent material such as glass, fused silica, or quartz. In a specific embodiment, the substrate is a soda lime glass. The process 110 includes forming a barrier material 205 overlying the substrate 201. The barrier material is used as a diffusion barrier for preventing sodium and other elements in the soda lime glass substrate from diffusing into the solar cell. Barrier material 205 can be silicon oxide, silicon nitride, titanium nitride, or other material. The process 110 further includes forming a conductive material 210 overlying the barrier material 205. In an example, the conductive material 210 can be patterned across the substrate to form a plurality of cell structures. Within each cell structure the conductive material 210 becomes a first electrode for each cell. Conductive material 210 is molybdenum in one embodiment. Other electrode materials such as transparent conductive oxide material, other metal materials may also be used, depending on the application.

An absorber material 220 overlying the first electrode for each cell. Typically the absorber material is a copper-indium-gallium-diselenide (CIGS) or copper-indium-gallium-selenium-sulfide (CIGSS) compound. It is formed in a two-step process by depositing a precursor thin film comprising copper, indium, or gallium species (overlying the first electrode) on the substrate and then performing a selenization and sulfurization process to treat the precursor at an elevated temperature to form the CIGS/CIGSS material. In certain embodiments, gallium species may be removed to obtain a CIS material. In certain other embodiments, the precursor material deposited earlier also include sodium species which help to modify the column grain structure of the CIS/CIGS/CIGSS thin film and enhance the power efficiency of the solar cell. Depending on the precursor preparation process including chemical stoichiometry control for the target devices and sputtering conditions, the absorber material contains a preferred atomic concentration ratio for Cu/(In+Ga) to be around 0.9±0.05, leading to stable and manufacture consist high power efficiency up to 14% or higher. In certain other embodiments, the absorber material also contains sulfur species appeared in compound $CuInGa(SeS)_2$. Of course, there are many variations, modifications, and alternatives. More detailed descriptions can be found in U.S. patent application Ser. No. 12/568,641, filed by one of the inventor to this application, commonly assigned to Stion Corporation, San Jose, Calif., and incorporated as references for all purposes.

Referring to FIG. 2, the absorber material 220 formed after the selenization and sulfurization process is a thin film having a surface region 221 exposed at the top and a thickness H for the film region. Depending on the doping species mixed in during the precursor formation process and interaction with selenium and sulfur gaseous species during the reactive thermal treatment process, absorber material 220 will have p-type conductivity throughout its thickness. In another embodiment, absorber material 220 is a substantially gray body and can absorb almost the entire visible spectrum, and the infrared region. When exposed to visible light, the absorber material 220 converts sunlight to electric current. When exposed to infrared light, the absorber material 220, heats quickly, converting the absorbed infrared light to thermal energy. The thermal energy can be transferred to any material in a vicinity of the surface region of the absorber material.

Figure 3:
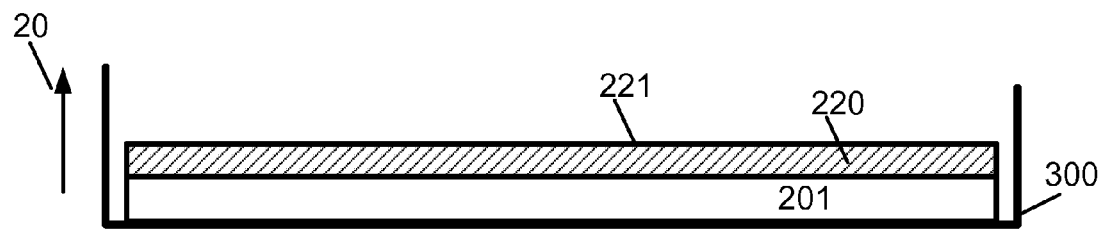
FIG. 3 is a simplified diagram illustrating a method for processing Cd-free solar cells according to an embodiment of the present invention.

As shown in FIG. 1, the method 100 further includes a process 115 for loading the substrate into a processing container with the surface region (of the absorber material) facing up. This process 115 is preparing the substrate and associated absorber material for surface treatment using chemical or thermal treating methods. Typically, the substrate has a planar shape, although other shapes including cylindrical, semispherical, flexible foil, or other shapes, can be used. FIG. 3 shows a substrate 201 having an overlying absorber material 220 loaded into a processing container 300. The absorber material 220 has a surface region 221 exposed and faced upward as indicated by arrow 20.

Figure 4A:
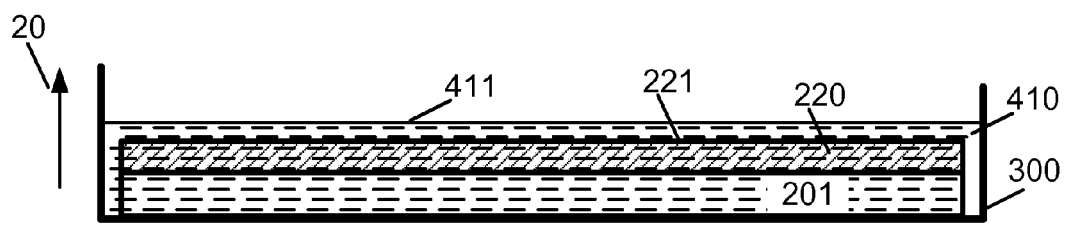
FIGS. 4A and 4B are simplified diagrams illustrating optional processes for fabricating Cd-free solar cells according to an embodiment of the present invention.

Referring to FIG. 1 again, the method 100 includes a process 120 for disposing a film material overlying the surface region. The film material includes zinc and is substantially free from cadmium, wherein the zinc species is intended to be doped either chemically or physically into the absorber material through the surface region. The film material can be either in a fluidic state or in a solid state. FIG. 4A is a diagram illustrating film material 410 in a liquid form in processing container 300 where a substrate 201 has been disposed with an exposed surface region 221 of absorber material 220. As shown, the surface 221 is facing upward. The film material is a liquid solution introduced with a surface 411 completely submerging the surface region 221. The liquid surface 411 is preferably a few millimeters above the surface 221. In a specific embodiment, the liquid solution 410 is an electrolyte containing a zinc salt solvent, ammonium hydroxide, and water. The zinc salt can be selected from various kinds of zinc compound such as zinc chloride $ZnCl_2$, zinc sulfide $ZnSO_4$, etc. The range of concentration for the zinc compound is 0.0001 Mole to 0.1 Mole, and for ammonium hydroxide 0.1 Mole to 5 Mole. Typically the liquid electrolyte solution is introduced substantially at room temperature.

Figure 4B:
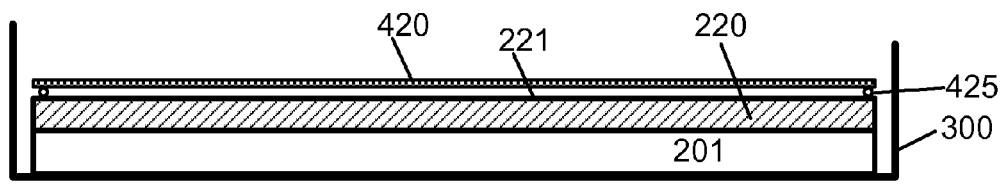

In an alternative specific embodiment, FIG. 4B illustrates a film material 420 in solid form applied over the surface 221. Film material 420 is spaced above the surface 221 with a gap ranging from 1 mm to 5 mm, e.g. by 425. Alternatively, the substrate bearing the solid film material 420 can be placed against the surface 221, provided that a handling mechanism is designed accordingly. In the configuration shown in FIG. 4B, because the film material 420 is a solid, the sample substrate 201 and associated absorber material 220 can be configured to non-horizontal orientations, depending on convenience of a manufacturing process.

As shown in FIG. 1, the method 100 includes a process 125 for heating the film material. The heaters provide thermal energy for inducing a doping process via either chemical or physical diffusion of desired dopant species within the film material into the surface region. A conventional way of heating the film material, especially for liquid film material, is to use the container itself as a heater, and maintaining the contents at an elevated temperature. That approach, however, requires more energy and causes the liquid to be somewhat unstable in its chemical properties, such as PH value, solvent concentration, etc. The present invention introduces a new approach of loading the substrate to be submerged, just under the surface of the liquid. This approach makes the process 125 of using lamp heaters an advantageous process to induce Cd-free doping from the film material into the surface region on the substrate.

Figure 5A:
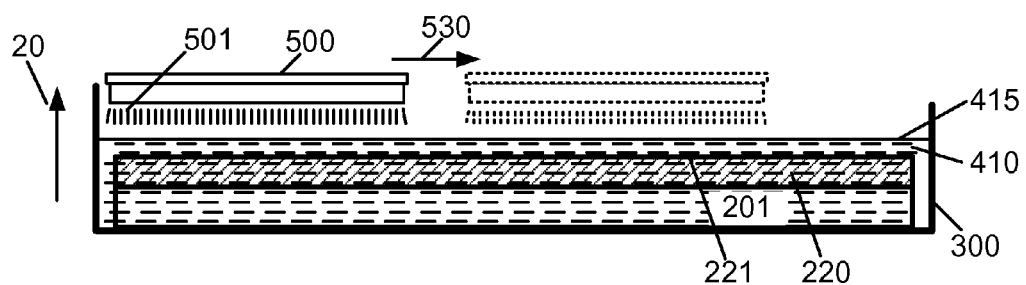
FIGS. 5A and 5B are simplified diagrams illustrating optional processes for fabricating Cd-free solar cells according to an embodiment of the present invention.

In a specific embodiment, as illustrated in FIG. 5A, the surface 221 of the absorber material 220 is fully submerged into the liquid solution 410 but in close proximity to the liquid surface. The lamp heater 500 above the liquid surface 415 provides thermal radiation 501 to the liquid 410 and the surface 221. Lamp heater(s) 500 can be typical quartz lamp heaters used in semiconductor processing for providing timed heat control. Additionally, the lamp heaters can have an elongated shape cover the large substrate dimension. In a specific embodiment, the lamp heaters 500 are configured to scan together along either the length or width of the substrate 201 in the processing container 300. A scanning mechanism 530 controlled to provide scanning step size, speed, and direction assures proper heating of each region of the surface 221. One advantage of using infrared heaters is the absorber material 220 is gray material which absorbs infrared light efficiently, thereby being heated quickly down to a controllable depth. Careful control of the lamp heaters causes only a small portion of the absorber material 220 to be heated from room temperature to about 190° F. or less down to a desired depth from the surface 221. This allows for relative higher surface temperature (about 190° F.) to be reached than by dipping the substrate into a warm liquid solution. Furthermore, only a portion of liquid solution 410 under the lamp heaters within a close proximity is heated to an elevated temperature (>room temperature) for causing the doping process between the liquid film material 410 above the surface 221 of the absorber material 220, while the rest portion of the aqueous solution remains at much lower temperature (e.g., room temperature). The localized liquid heating provides better stability of the solution mixture and minimizes ammonia loss.

Figure 5B:
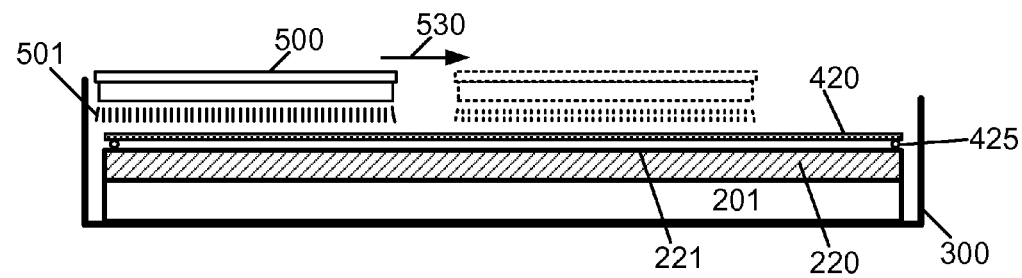

In an alternative embodiment as shown in FIG. 5B, the film material 420 is in solid form. The alternative substrate is substantially transparent to thermal radiation (at least for infrared) so that the process 125 of using lamp heaters 500 with a scanning mechanism 530 can be adapted to this configuration. The film material 420 contains zinc compound that is volatile under the illumination of infrared light 501 and is able to diffuse out of the film material 420. The surface region 221, which is directly under the film material 420, is also heated and is able to receive the zinc down to the depth into the film region of the absorber material 220. The use of a solid layer enables the process to be carried out in almost any orientation, as opposed to being limited to horizontal.

Referring further to FIG. 1, the method 100 includes a process 130 for forming a zinc doped layer within the surface region. As shown in both FIG. 5A and the FIG. 5B, the method 100 has established a localized surface heating using both the loading configuration and use of lamp heaters. In a specific embodiment, the surface region of the absorber material includes a CIS/CIGS/CIGSS compound. Because thermal power can be well controlled by the lamp heaters, only a surface region is heated quickly from room temperature up to about 190° F. to make only surface reaction taking place and dopant diffusion occurring from the film material (either a liquid solution or a volatile solid film) into a particular controllable depth of the absorber material. In particular, the reaction rate between the liquid solution containing zinc chloride and ammonium hydroxide with the CIS/CIGS/CIGSS absorber material is limited by the temperature at the depth where it is needed. The ammonium hydroxide content in the liquid film material helps to clean the surface by reacting with the sodium in the CIS/CIGS/CIGSS absorber material or oxides formed on the surface region. This enables reducing the thickness of the barrier for blocking the zinc species diffusion through the surface region. Also, the zinc diffusion depth is more easily controlled as the diffusion rate is highly depended on the temperature. Therefore, the process 130 causes a transformation of a portion of the absorber material from the surface region down to the depth from the CIS/CIGS/CIGSS material to a layer doped with a substantial amount of zinc. In particular, by a selection of the film material the dopants can be made substantially free of cadmium or other toxic elements.

Figure 6:
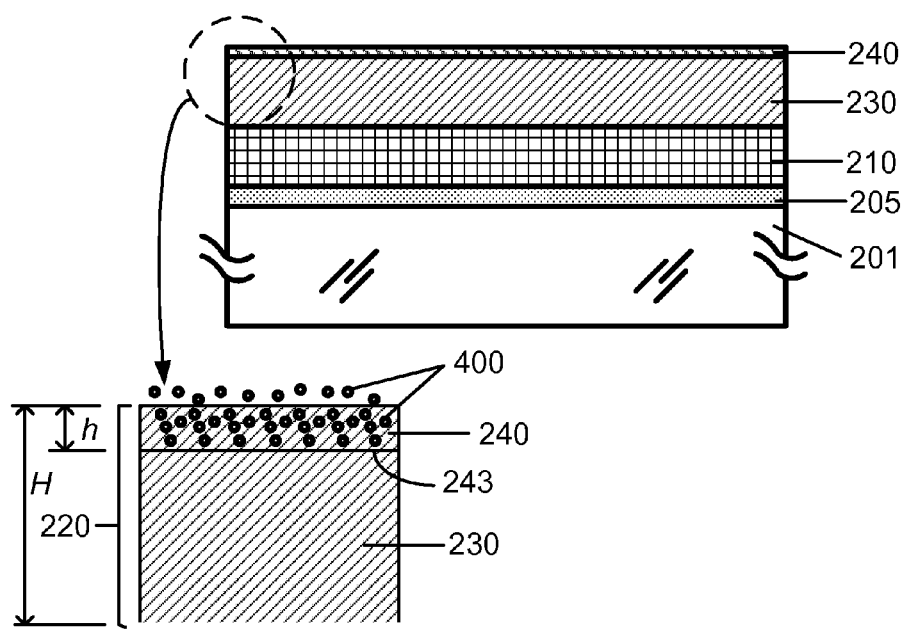
FIG. 6 is a simplified diagram illustrating a sectional view of a photovoltaic junction for a Cd-free solar cell according to an embodiment of the present invention.

FIG. 6 is a cross-sectional view of a zinc doped layer formed in the surface of absorber material based on the process described above. As shown, the original absorber material having a thickness H of film region now is transformed into two regions separated by an interface region 243. Below the interface region 243 is a film region 230 being essentially the absorber material with its original characteristics. Above the interface region 243 up to the surface is an junction structure 240 having a thickness h which corresponds to the depth of the zinc 400 diffused from the film material (see FIGS. 5A and 5B).

In one embodiment, the thickness H of the original absorber material 220 ranges from 1 μm to 2 μm. The junction structure 240 can have a thickness ranging from 10 nm to 50 nm, about 0.5 to 5 percent of the total thickness of original absorber material. It is known that the zinc species is a good n-type donor for the CIS/CIGS/CIGSS compound. As a result of the thermal assisted diffusion process, at least some of the zinc in the junction structure may be ionized and become an-type dopant therein. The zinc doping helps to transform a top portion of the absorber material characterized by p-type conductivity into a junction structure characterized by n-type conductivity. In other words, the interface region 243 becomes a boundary separating a p-type film region 230 and an n-type region 240, forming a semiconductor p-n junction. Depending on the embodiments and applications, the zinc doping level can be about $10^{20}$ cm$^{-3}$ in atomic concentration and n-type doping level due to ionized zinc species can range from $10^{15}$ cm$^{-3}$ to $10^{18}$ cm$^{-3}$. The zinc doping substantially replaces the role of cadmium played in an n-type CdS buffer layer formed on top of the CIS/CIGS/CIGSS absorber material. Of course, other surface reaction and diffusion methods can be used to form the layers described herein.

In one embodiment, the method 100 further includes a process 135 to load the substrate including the CIS/CIGS/CIGSS absorber p-n junction without cadmium species into a chamber. In certain implementation, the surface of the above substrate with the p-n junction can be pretreated using fluidic chemical including ammonium hydroxide or cyanide to clean up and remove some oxides. The chamber is a vacuum chamber designed for performing metal-organic chemical vapor deposition (MOCVD). One or more conductive transparent materials can be deposited overlying the zinc doped junction layer formed in process 130.

Following process 135, a process 140 for depositing zinc oxide film material over the zinc-doped junction structure is performed. In a specific embodiment, the zinc oxide is deposited using a MOCVD technique in the chamber with a vacuum environment. Then a work gas including reactants and dopants is mixed with a carrier gas, flowing into the chamber. In one embodiment the reactants include a zinc bearing species such as diethylzinc gas mixed with water vapor. The dopants can include diborone gas. The carrier gas is an inert gas, e.g. nitrogen, argon, or helium. The substrate, as loaded on a heating plate, heated to a temperature in a range of 150° C. to 250° C., preferably within 200-250° C. At these elevated temperatures, zinc in the diethylzinc gas decomposes and reacts with the oxygen in water vapor to form a zinc oxide film on the surface of the junction structure. At the same time, additional zinc species within the junction structure may be further activated to contribute for final n-type conductivity of the junction structure or window layer for the solar cell.

At the same time, the zinc dopant is subjected to further thermal diffusion within the layer so that the junction location or the interface region may shift. In a specific embodiment, the zinc oxide film over the junction may be formed using a MOCVD process without extra doping. The process can be carried out with a reduced flow of, or elimination of dopant gas so that the zinc oxide film has a high resistivity. In an example, the high resistivity is in a range of about $10^2$ to $10^4$ mΩ·cm and greater. The relative high resistivity of the zinc oxide film helps to reduce the possibility of shunts, or formation of conducting phases, so that a good ohmic contact can be formed. The zinc oxide film has good optical transparency, e.g. an optical transmission rate of 80% and greater at least for light spectrum ranging from near UV to infrared light. The zinc oxide film material formed in this process can have a thickness range from 10 nm to 100 nm for minimizing shunting while keeping good optical transparency. In another embodiment, the zinc oxide film material without adding diborone dopant gas can be replaced by depositing a $ZnO_{1-x}S_x$ layer by continuously flowing water vapor and $H_2S$ gas during the MOCVD process. In yet another embodiment, the zinc oxide film or some replacement film bears a character of high resistivity and substantial transparency to sun light spectrum is formed overlying the zinc doped layer to lead a formation of a Cd-free window material for the thin-film solar cell for collecting electrons converted from photons by the absorber material.

Method 100 includes a process 145 of forming a transparent conductive electrode over the zinc oxide film. Many transparent conductive oxides (TCO) such as zinc oxide, indium tin oxide (ITO), fluorine doped tin oxide (FTO), and the like can be used. One approach is to continue depositing a second zinc oxide film material within the previous chamber using MOCVD process for forming the first zinc oxide film material in process 140. In a specific embodiment, the dopants gas flow during MOCVD process is adjusted for appropriate physical characteristics of the transparent conductive material. For example, the diborone gas flow may be turned on with a flow rate so that boron doping occurs during the formation of the second zinc oxide film material. The second zinc oxide film for forming the upper electrode of the solar cell has resistivity of a few mΩ·cm. Additionally, the second zinc oxide film material will have a optical transmission rate, e.g. 90%, which is higher than the first zinc oxide film material.

Figure 7:
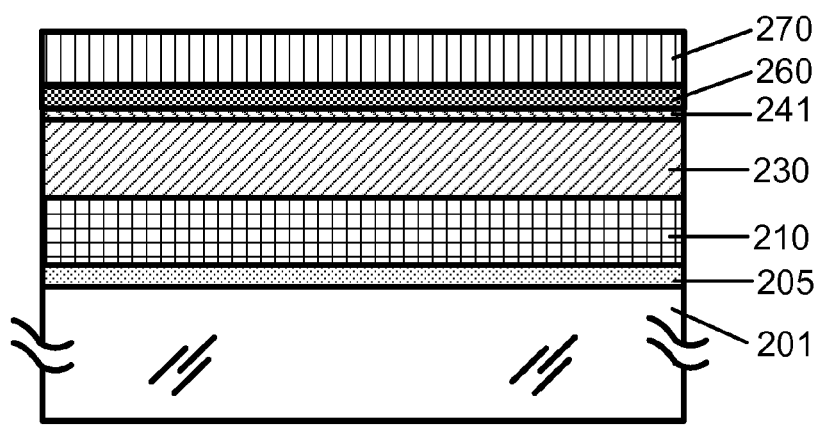
FIG. 7 is a simplified diagram illustrating a sectional view of a Cd-free solar cell according to an embodiment of the present invention.

FIG. 7 is an illustration of a section of thin-film solar cell free of cadmium species. The thin-film solar cell is formed on a glass substrate 201 with a form factor as large as 65×165 cm. A barrier layer 205 overlies substrate 201. On the barrier layer 205, a first electrode 210 is formed, for example of metal. Then an absorber material 230 is formed and treated. In a specific embodiment, the absorber material comprises a compound such as $CuInGaSe_2$, $CuInSe_2$, $CuInGaSe_2$, $CuInGa(SeS)_2$, or a compound without Ga. This includes several manufacturing processes, including precursor film deposition and precursor treatment via a selenization and sulfurization process. The CIS/CIGS/CIGSS absorber material is further treated during a formation of a zinc doped junction structure 240. The zinc doped junction structure 240 is formed by using a chemical bath reaction between a zinc bearing solution with the CIS/CIGS/CIGSS absorber material. A top portion of the CIS/CIGS/CIGSS absorber material is transformed into a zinc-doped n-type characteristic structure separated to the p-type absorber material 230 by an interface region. The zinc doped junction structure 240 can also formed by a direct physical diffusion to allow volatile zinc species through a surface region of the CIS/CIGS/CIGSS absorber material.

The first zinc oxide film 260 overlying the junction layer 241 is characterized by high resistivity by cutting off Boron doping gas flow during its formation process and forms a Cd-free window material together with the n-type zinc doped layer over the p-type absorber material. This basically eliminates a CdS buffer layer and associated chemical bath deposition process as well as certain surface treatment process so that the thin-film solar cell is substantially free of toxic elements and is formed with simplified processes. Finally, a second zinc oxide film 270 can be formed using the MOCVD process to deposit while flowing diborone dopant gas to obtain a characteristic with lower resistivity and an equal or higher optical transparency compared to the first zinc oxide film 260. The second zinc oxide film 270 is patterned to form a second electrode for the thin-film solar cell. Of course there can be other variations, modifications, and alternatives.

Following the formation of the zinc doped junction structure, a first zinc oxide film 260 is deposited, e.g. using a MOCVD process which may be followed by an annealing process using rapid thermal annealing. These processes further activate additional zinc species in the zinc doped junction structure to determine a final zinc doping level within the junction structure and modifies the location of the interface region (junction position). The result is an n-type doping level ranging from $10^{15}$ cm$^{-3}$ to $10^{18}$ cm$^{-3}$. The first zinc oxide film 260 overlying the junction structure 241 is characterized by a high resistivity achieved by cutting off boron dopant gas flow during its formation process, thus forming a Cd-free window material together with then-type zinc doped junction structure over the p-type absorber material. This basically eliminates a CdS buffer layer and associated chemical bath deposition process, as well as certain surface treatment processes so that the thin-film solar cell is substantially free of toxic elements. Finally, a second zinc oxide film 270 can be formed using the MOCVD process while flowing diborone dopant gas to obtain a lower resistivity and higher optical transparency compared to the first zinc oxide film 260. The second zinc oxide film 270 is patterned to form a second electrode for the thin film solar cell.

The above sequence of steps provides a cadmium free thin-film photovoltaic device and method of forming thereof according to an embodiment of the present invention. Depending on the embodiment, steps may be added or removed without departing from the scope of the claims herein. For example, the window material and second electrode material can be deposited using techniques such as sputtering, vacuum evaporation, and chemical bath deposition, among others.

Figure 8:
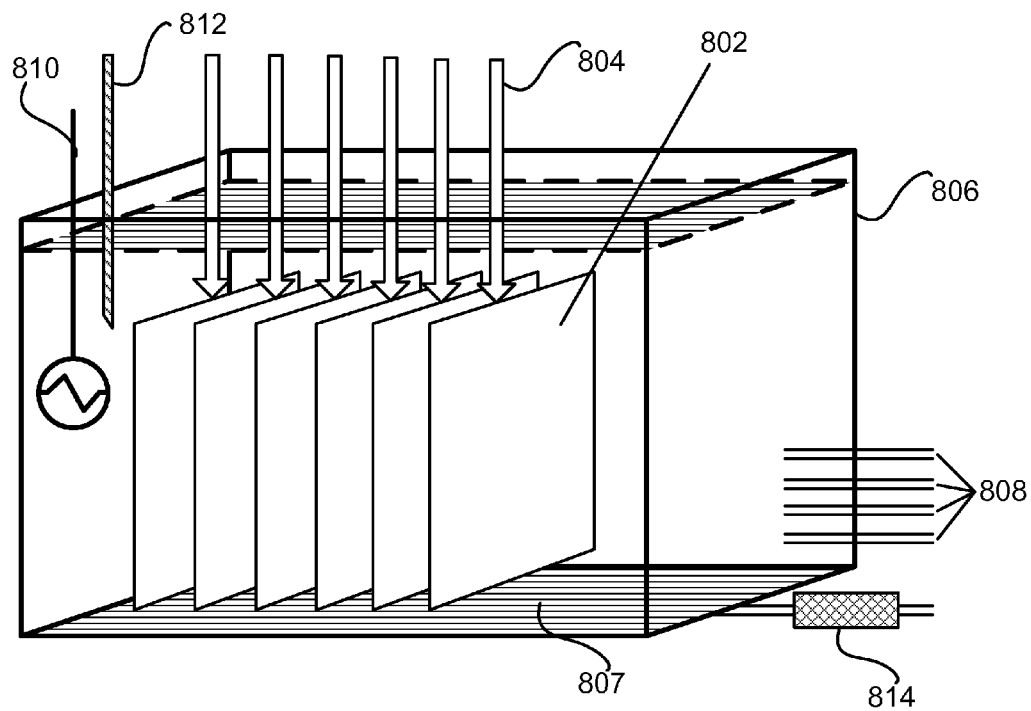
FIG. 8 is a simplified diagram illustrating a chemical bath system for depositing a Zinc-based buffer layer of a cadmium free thin-film photovoltaic device according to an alternative embodiment of the present invention.

In an alternative embodiment, the method includes a dip-in chemical bath deposition (CBD) process for forming a cadmium-free buffer layer, replacing almost all the processes from 120 to 130. In this embodiment, Cd-free materials are selected from zinc sulfide (ZnS), zinc selenide (ZnSe), zinc oxide (ZnO), zinc magnesium oxide (ZnMgO), or the like for this dip-in CBD process. FIG. 8 is a simplified diagram illustrating a chemical bath system for forming a buffer material overlying the photovoltaic absorber material for forming the cadmium free thin-film photovoltaic device according to an embodiment of the present invention. As shown, the buffer material can be provided using a Zinc CBD process by forming a Zinc-based conductive layer within a chemical bath 807 of an aqueous solution. In this process, a plurality of substrates 802 including at least a bottom electrode layer and an absorber layer pre-formed on a glass substrate are provided, usually in a holder or a tray device (not shown). The holder or the tray device is configured to immerse 604 the plurality substrates 802 into the chemical bath 807 to execute a dipping process during which a chemical reaction induced film growth of Zinc-based buffer layer occurs within a predetermined time, for example, 30 minutes.

In a specific embodiment, the chemical bath 807 is prepared as an aqueous solution by adding and mixing various solutions respectively containing zinc species, ammonia species, organosulfur species, and sodium hydroxide species into a heated bath of water. In a specific embodiment, for the manufacture of a Cd-free thin-film solar cell Zinc-based species is used to replace Cd-based salt species. The Zinc-based species can be derived from various zinc salts such as zinc acetate, zinc iodide, zinc sulfate, zinc nitrate, zinc chloride, zinc bromide, zinc phosphoride and others. In a specific embodiment, the zinc salt species is selected from a hydrated zinc sulfate, a hydrated zinc chloride, or hydrated zinc nitrate. In another specific embodiment, the zinc salt species is added as a form of a solution of zinc-salt. The organosulfur species can be provided using compounds as thiourea (with a chemical formula SC(NH$_2$)$_2$), but can be others. Other organosulfur compounds may include dimethyl thiourea (with a chemical formula (CH$_3$)$_2$S) and other suitable chemistries, and combinations may be employed. In an example, a thiourea solution is added to the final aqueous solution of the chemical bath 807 with a concentration of about 60 mMole. Of course there can be other variations, modifications, and alternatives.

The sodium hydroxide species is added as an ingredient like a catalyst reagent for substantially enhancing the film growth rate and tuning oxygen and sulfur content in the deposited film under the CBD process. In a specific embodiment, a sodium hydroxide solution is added into the final aqueous solution of the chemical bath 807 up to a [NaOH] concentration of about 4 mMole, the resulted CBD growth rate is increased by factor of 2.5× comparing to the growth rate without adding the sodium hydroxide species. Another advantage of NaOH reagent is very inexpensive which is substantially more cost-effective method comparing to directly increase concentration of major ingredients like the Zinc Salt and organosulfur compounds. In certain application, different catalyst other than NaOH solution may be also included.

In a specific embodiment, a method of producing the chemical bath is provided. In an implementation, hot water is first provided in the chemical bath system. The hot water can be set to a temperature ranging from about 70° C. to about 80° C. in a specific embodiment. A heating device can be installed in the chemical bath system to heat the bath of water and maintain the temperature of final aqueous solution at the desired reaction temperature of around 75° C. Secondly, an ammonia solution having a concentration of about 42 weight percent is added to the preheated bath of water to provide for an ammonia concentration of about 1.6 Mole or a pH of about 11 to 12 in the final aqueous solution in a specific embodiment. Then, a sodium hydroxide NaOH solution is added into the bath of water containing the ammonia species. The addition of NaOH solution further increases [OH—] concentration in the bath of the aqueous solution. In one way it changes PH value of the solution, in another way it enhances the growth rate of the Zn-baed thin-film deposited through the CBD process. In an example, for adding NaOH species up to about 4 mMole in the final aqueous solution of the chemical bath, the growth rate of CBD film is increase 2.5 folds.

Additionally, zinc salt species, as a major ingredient of the chemical bath, is firstly dissolved in water to form a solution and introduced into the aqueous solution containing the ammonia species and NaOH species with a final [Zn] concentration of greater than 1 mMole. Furthermore, the organosulfur species as another major ingredient for forming the chemical bath, is added via a thiourea solution into the aqueous solution containing the ammonia species and zinc salt species. In a specific embodiment, it is desired to have the thiourea concentration in the final aqueous solution is more than 20 times of a concentration of the zinc species. That is, the zinc species is a limiting species in a specific embodiment. In a specific example, for higher growth rate the zinc species with a concentration of >1 nMole is provided. As a result, chemical reaction among the zinc species, OH—, and thiourea species through the CBD process produces a high-quality conductive zinc-oxygen-sulfide buffer material having a thickness of about 200 Angstroms in a 30 min. CBD process time. Of course, there can be other variations, modifications, and alternatives.

In a specific embodiment, the chemical bath 807 is provided in an enclosure 806 with suitable dimensions and materials. In a specific embodiment, the enclosure 806 for the chemical bath is characterized by a width, a length, a height and an internal volume. For example, the chemical bath 807 can have an internal volume of about 250 gallons to about 1000 gallons in certain embodiments, but can be others. In a specific embodiment, the enclosure 806 can be made of a suitable plastic material and/or fiberglass and/or solid material, which has a suitable chemical resistant coating. In a specific embodiment, the enclosure is subjected to flow from one or more pumping devices, which are coupled to the chemical bath 807 and enclosure 806. In a specific embodiment, the flow provides for a constantly stirred reactor configuration, but can be others. As shown, the chemical bath system includes one or more manifolds 808 to allow the various chemical species to be added to the bath of water in the enclosure 806 to form the chemical bath 807, independently or concurrently. In certain embodiment, the chemical bath system can include one or more heating devices 810 and/or temperature monitoring devices 812 to ensure the reaction at a desired temperature above room temperature. Particularly, the reaction temperature is controlled within 5 degrees of a nominal 75° C. The heating device 810 may be provided using an immersion heater in some embodiments. In a specific embodiment, the heater 810 is coated with a suitable material and provides thermal energy to the chemical bath 807. In a specific embodiment, the heater also has safety and/or alarm devices to stop the thermal process and the like. Of course, there can be other variations, modifications, and alternatives.

Referring again to FIG. 8, in a specific embodiment, the chemical bath system includes one or more filter elements 814 and associated devices. The one or more filter elements can have a nominal pore size of about 5 microns to remove a zinc salt colloid species formed in the chemical bath. The associated devices can include a pump and others to circulate the aqueous solution through the one or more filter elements and back into the chemical bath 807 after removing the cadmium salt colloid species. The one or more filter elements 814 can be arranged parallel or in series or a combination depending on the embodiment. In a specific embodiment, the filters are configured within a filter housing, which is chemical resistant and subjected to pressure from the pump. In a preferred embodiment, the filters are typically replaced with a pressure drop and/or increase of predetermined amount occurs or other suitable frequencies. Of course there can be other variations, modifications, and alternatives.

In a specific embodiment, after forming the Cd-free Zinc-oxygen-sulfide buffer layer with a thickness ranging from 10 nm to 30 nm in this dip-in CBD process, the method includes removing the plurality of substrates 802 containing thin-film photovoltaic absorber material overlaid by the buffer layer from the chemical bath 807 and subjects these substrates to one or more cleaning process. In a specific embodiment, the cleaning process is a rinsing process using deionized water to remove any chemical residuals from the buffer layer surface and the back side region of glass substrates. In particular on the back side region the zinc-oxygen-sulfide material may be stick there in a powdered form, which can be removed using the rinsing water or can be removed mechanically, for example by scraping. The rinsing process may include one or more rounds of rinses using deionized water. The plurality of substrates is then carried into a drying process after the rinsing process. Of course, there can be other variations, modifications, and alternatives.

In a specific embodiment, after drying, the plurality of photovoltaic devices are stored in a desiccated environment before further processing. The desiccated environment prevents exposure of the plurality of photovoltaic devices to moisture and other contaminations that may affect the performance of the photovoltaic device. In a specific embodiment, the environment has a relative humidity of less than about 50% or less than about 10%. The temperature can be about room temperature or slightly lower or higher according to a specific embodiment.

While the present invention has been described using specific embodiments, it should be understood that various changes, modifications, and variations to the method utilized in the present invention may be effected without departing from the spirit and scope of the present invention as defined in the appended claims. Additionally, embodiments according to the present invention can be applied to other thin film configurations such as those provided by a metal oxide material, a metal sulfide material or a metal selenide material.

What is claimed is:

1. A method for fabricating a thin film photovoltaic device, the method comprising:
   providing a plurality of substrates, each of the substrates having a surface region, an overlying first electrode material, and a photovoltaic absorber material;
   providing a chemical bath comprising an including a zinc salt species, an ammonia species, an organosulfur species, and a sodium hydroxide species, wherein the aqueous solution is dynamically maintained at a pH of between about 11 and about 12;
   immersing the plurality of substrates in the chemical bath;
   maintaining the chemical bath at a temperature ranging from about 70 to about 80 degrees Celsius during at least the immersing of the plurality of substrates;
   while the substrates are immersed, forming a buffer layer including at least a zinc-oxygen-sulfide compound free of cadmium with a thickness ranging from 10 nm to 30 nm overlying the photovoltaic absorber material;
   removing the plurality of substrates having at least the photovoltaic absorber material and the buffer material from the chemical bath; and
   subjecting the plurality of substrates to a cleaning solution followed by a drying process.

2. The method of claim 1 wherein the photovoltaic absorber material comprises a thin film of $CuInGaSe_2$ or $CuInGa(SeS)_2$ compound material.

3. The method of claim 1 wherein the organosulfur species comprises thiourea.

4. The method of claim 1 wherein the ammonia species is derived from an aqueous ammonia.

5. The method of claim 1 wherein the zinc salt species is derived from a hydrated zinc sulfate, a hydrated zinc chloride, or hydrated zinc nitrate.

6. The method of claim 3 wherein the thiourea has a concentration at least 25 times greater than that of the zinc salt species in the aqueous solution.

7. The method of claim 1 further comprising:
   producing the chemical bath by the steps of:
      heating a bath of water to a temperature ranging from about 70 degrees Celsius to about 80 degrees Celsius;
      adding aqueous ammonia to mix with the bath of water to form an ammonia solution;
      adding a solution of sodium hydroxide into the ammonia solution;
      adding a solution of zinc salt;
      adding a solution of thiourea.

8. The method of claim 7 wherein the chemical bath comprises a concentration of $[OH^-]$ about 4 mMole or more.

9. The method of claim 7 wherein the chemical bath comprises a $[Zn]$ concentration of more than 1 mMole.

10. The method of claim 7 wherein the chemical bath comprises a concentration of thiourea about 60 mMole.

11. The method of claim 7 wherein the chemical bath comprises has a concentration of $[NH_4OH]$ about 1.6 Mole.

12. The method of claim 1 wherein each of the plurality of substrates is soda lime glass.

13. The method of claim 1 wherein the first electrode material comprises molybdenum.

14. The method of claim 1 wherein the cleaning solution comprises rinse water.

15. The method of claim 1 wherein immersing the plurality of substrates comprises dipping the plurality of substrates substantially vertically in the chemical bath for 30 minutes.

* * * * *